US010925142B2

(12) United States Patent
Hsu et al.

(10) Patent No.: US 10,925,142 B2
(45) Date of Patent: Feb. 16, 2021

(54) EUV RADIATION SOURCE FOR LITHOGRAPHY EXPOSURE PROCESS

(71) Applicant: Taiwan Semiconductor Manufacturing Co., Ltd., Hsinchu (TW)

(72) Inventors: Chun-Chia Hsu, Kaohsiung (TW); Kuan-Hung Chen, Taoyuan (TW); Shang-Chieh Chien, New Taipei (TW); Li-Jui Chen, Hsinchu (TW); Po-Chung Cheng, Zhongpu Shiang (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 190 days.

(21) Appl. No.: 16/149,643

(22) Filed: Oct. 2, 2018

(65) Prior Publication Data
US 2020/0045800 A1 Feb. 6, 2020

Related U.S. Application Data

(60) Provisional application No. 62/712,291, filed on Jul. 31, 2018.

(51) Int. Cl.
*H05G 2/00* (2006.01)
*G03F 7/20* (2006.01)
*G21K 1/06* (2006.01)

(52) U.S. Cl.
CPC ......... *H05G 2/008* (2013.01); *G03F 7/70033* (2013.01); *G03F 7/7055* (2013.01); *G21K 1/06* (2013.01)

(58) Field of Classification Search
CPC .. G03F 7/7033; G03F 7/70025; G03F 7/7055; G03F 7/70983; H05G 2/005; H05G 2/008; H05G 2/002; H05G 2/00; H05G 2/001; H05G 2/006; G21K 1/06
See application file for complete search history.

(56) References Cited

U.S. PATENT DOCUMENTS

| 8,764,995 | B2 | 7/2014 | Chang et al. |
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 7/2015 | Huang et al. |
| 9,184,054 | B1 | 11/2015 | Huang et al. |
| 9,256,123 | B2 | 2/2016 | Shih et al. |

(Continued)

*Primary Examiner* — Dani Fox
*Assistant Examiner* — Soorena Kefayati
(74) *Attorney, Agent, or Firm* — McClure, Qualey & Rodack, LLP (57) ABSTRACT

An extreme ultraviolet (EUV) lithography system is provided. The EUV lithography system includes the above-mentioned extreme ultraviolet (EUV) radiation source. The EUV lithography system further includes a collector configured to collect and reflect the EUV radiation and a mask stage configured to secure an EUV mask. The EUV lithography system also includes a wafer stage configured to secure a semiconductor wafer. In addition, the EUV lithography system includes one or more optical modules configured to direct the EUV radiation from the radiation source to image an integrated circuit (IC) pattern defined on the EUV mask onto the semiconductor wafer.

20 Claims, 9 Drawing Sheets

(56) References Cited

U.S. PATENT DOCUMENTS

| | | |
|---|---|---|
| 9,529,268 B2 | 12/2016 | Chang et al. |
| 9,548,303 B2 | 1/2017 | Lee et al. |
| 2003/0142198 A1* | 7/2003 | Miyake .............. G03F 7/70033 347/246 |
| 2006/0219957 A1* | 10/2006 | Ershov ................. B82Y 10/00 250/504 R |
| 2007/0001130 A1* | 1/2007 | Bykanov .............. H05G 2/001 250/493.1 |
| 2008/0087847 A1* | 4/2008 | Bykanov .............. H05G 2/008 250/504 R |
| 2008/0116400 A1* | 5/2008 | Schmidt ............... H05G 2/003 250/504 R |
| 2008/0149862 A1* | 6/2008 | Hansson ............ G03F 7/70033 250/504 R |
| 2010/0078577 A1* | 4/2010 | Moriya .................. H01S 3/10 250/504 R |
| 2010/0181503 A1* | 7/2010 | Yanagida .............. H05G 2/003 250/504 R |
| 2010/0193710 A1* | 8/2010 | Wakabayashi ........ H01S 3/0007 250/504 R |
| 2011/0220816 A1* | 9/2011 | Kakizaki .............. H05G 2/003 250/504 R |
| 2011/0317256 A1* | 12/2011 | Hou .................... H01S 3/0078 359/337.21 |
| 2012/0080584 A1* | 4/2012 | Partlo ................... H05G 2/008 250/214.1 |
| 2012/0305811 A1* | 12/2012 | Wakabayashi ........ H05G 2/003 250/504 R |
| 2013/0063803 A1* | 3/2013 | Delgado ............... H05G 2/005 359/278 |
| 2013/0207004 A1* | 8/2013 | Ceglio .................. H05G 2/005 250/504 R |
| 2013/0209077 A1* | 8/2013 | Yabu .................... F24H 1/0018 392/441 |
| 2014/0091239 A1* | 4/2014 | van der Burgt ....... H05G 2/008 250/504 R |
| 2014/0111635 A1* | 4/2014 | Suzuki .................. H05G 2/008 348/86 |
| 2014/0191132 A1* | 7/2014 | Schafgans ............. H05G 2/003 250/372 |
| 2014/0253716 A1* | 9/2014 | Saito .................... H05G 2/005 348/87 |
| 2014/0264087 A1* | 9/2014 | Rafac ..................... G21K 5/00 250/504 R |
| 2015/0043599 A1* | 2/2015 | Yanagida .............. H01S 3/1106 372/18 |
| 2015/0268559 A1* | 9/2015 | Badie ................. G03F 7/70033 430/322 |
| 2016/0087389 A1* | 3/2016 | Niwano ................ H01S 3/0064 250/504 R |
| 2016/0274465 A1* | 9/2016 | Lu ...................... G03F 7/70033 |
| 2016/0320708 A1* | 11/2016 | Lu ......................... H05G 2/005 |
| 2017/0048960 A1* | 2/2017 | Riggs .................... H05G 2/003 |
| 2017/0064799 A1* | 3/2017 | Yabu ..................... H05G 2/006 |
| 2017/0311429 A1* | 10/2017 | Rafac .................... H05G 2/008 |
| 2018/0077786 A1* | 3/2018 | Price .................... H05G 2/008 |
| 2018/0199422 A1* | 7/2018 | Yabu ..................... H05G 2/006 |
| 2018/0254597 A1* | 9/2018 | Van Der Post ....... H01J 47/026 |
| 2018/0259861 A1* | 9/2018 | Langlois ............... H05G 2/005 |
| 2018/0351318 A1* | 12/2018 | Abe .................... G02B 27/1013 |
| 2019/0361361 A1* | 11/2019 | Nishimura ............ H05G 2/005 |
| 2020/0068695 A1* | 2/2020 | Nagano .............. H01L 21/0275 |

* cited by examiner

EUV RADIATION SOURCE FOR LITHOGRAPHY EXPOSURE PROCESS

PRIORITY CLAIM AND CROSS-REFERENCE

This application claims the benefit of U.S. Provisional Application No. 62/712,291, filed on Jul. 31, 2018, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1-100 nm. One type of EUV radiation source is laser-produced plasma (LPP). LPP technology produces EUV radiation by focusing a high-power laser beam onto small fuel droplet target droplets to form highly ionized plasma that emits EUV radiation with a peak of maximum emission at 13.5 nm. The EUV radiation is then collected by a collector and reflected by optics towards a lithography exposure object, e.g., a wafer.

Although existing methods and devices for generating EUV radiation have been adequate for their intended purposes, they have not been entirely satisfactory in all respects. Consequently, it would be desirable to provide a solution for increasing power conversion efficiency from the input energy for ionization.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The present disclosure is generally related to extreme ultraviolet (EUV) lithography system and methods. More particularly, it is related to apparatus and methods for improving efficiency in laser produced plasma (LPP) EUV radiation sources and mitigating contamination on LPP collectors in the LPP EUV radiation sources. One challenge in existing EUV lithography system is the low efficiency of generating EUV radiation, which directly impacts wafer throughput. An object of the present disclosure is to optimize parameters of LPP EUV radiation sources so as to improve their EUV conversion efficiency. Another challenge is the degradation of LPP collectors or EUV collectors. An LPP collector collects and reflects EUV radiation and contributes to overall EUV conversion efficiency. However, it is subjected to damages and degradations due to the impact of particles, ions, radiation, and debris deposition. Accordingly, another object of the present disclosure is directed to reducing debris deposition onto LPP collectors thereby increasing their usable lifetime.

Figure 1:
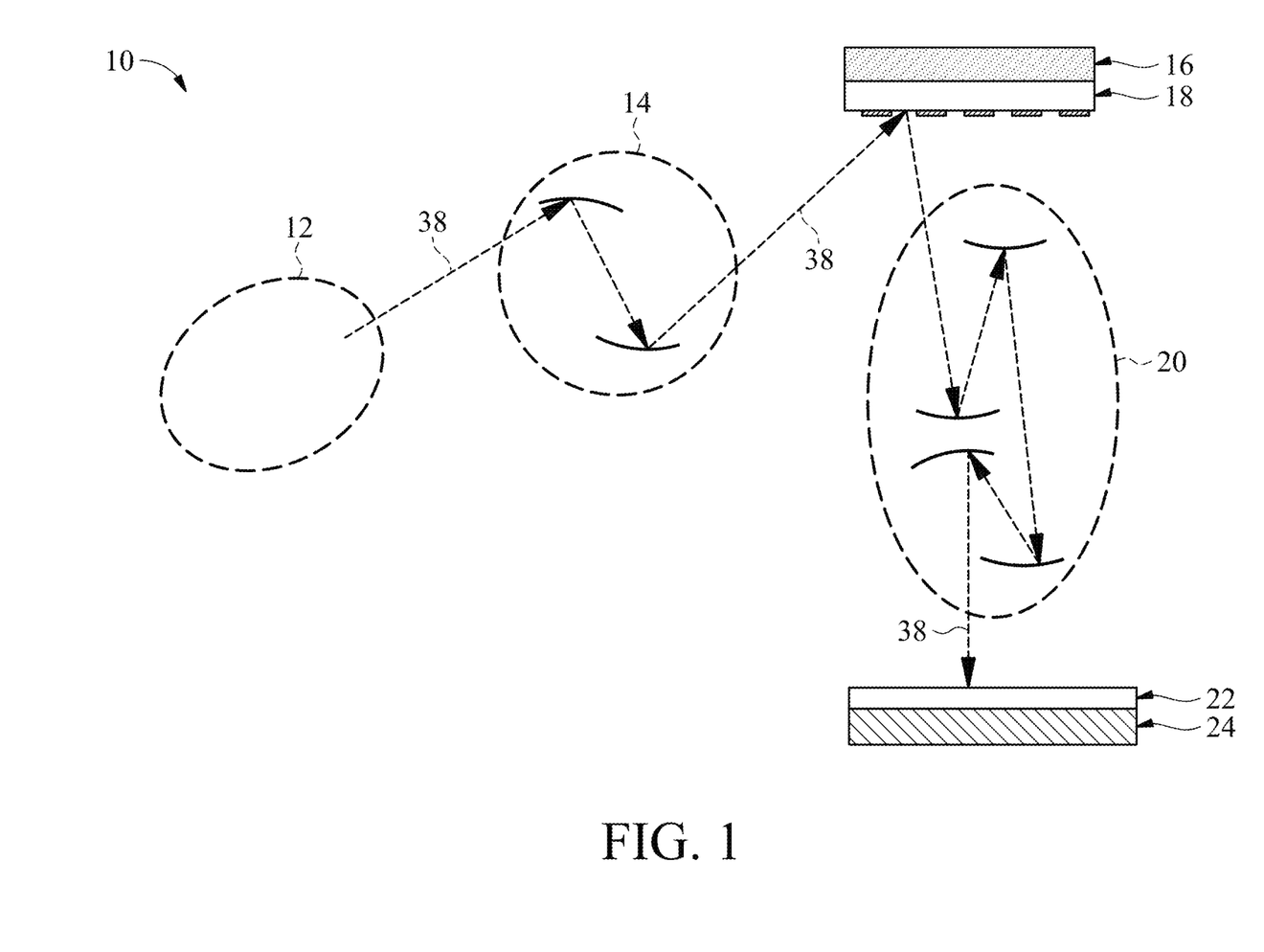
FIG. 1 shows a schematic view of a lithography system with a radiation source, in accordance with some embodiments.

FIG. 1 is a schematic and diagrammatic view of a lithography system 10, constructed in accordance with some embodiments. The lithography system 10 may also be generically referred to as a scanner that is operable to perform lithography exposing processes with respective radiation source and exposure mode. In the present embodiment, the lithography system 10 is an extreme ultraviolet (EUV) lithography system designed to expose a resist layer by EUV radiation (or EUV radiation). The resist layer is a material sensitive to the EUV radiation. Because gas molecules absorb EUV radiation, the lithography system 10 is maintained in a vacuum environment to avoid the EUV intensity loss. The EUV lithography system 10 employs a radiation source 12 to generate EUV radiation 38, such as EUV radiation having a wavelength ranging between about 1 nm and about 100 nm. In one particular example, the radiation source 12 generates an EUV radiation 38 with a wavelength centered at about 13.5 nm. Accordingly, the radiation source 12 is also referred to as EUV radiation source 12. In the present embodiment, the EUV radiation source 12 utilizes a mechanism of dual pulse laser-produced plasma (LPP) to generate the EUV radiation 38, which will be further described later.

The lithography system 10 also employs an illuminator 14. In various embodiments, the illuminator 14 includes reflective optics such as a single mirror or a mirror system having multiple mirrors in order to direct the EUV radiation 38 from the radiation source 12 onto a mask stage 16, particularly to a mask 18 secured on the mask stage 16. The mask stage 16 is included in the lithography system 10.

In some embodiments, the mask stage 16 includes an electrostatic chuck (e-chuck) to secure the mask 18. In the present disclosure, the terms mask, photomask, and reticle are used interchangeably. In the present embodiment, the mask 18 is a reflective mask. One exemplary structure of the mask 18 includes a substrate with a low thermal expansion material (LTEM). In various examples, the LTEM includes $TiO_2$ doped $SiO_2$, or other suitable materials with low thermal expansion. The mask 18 includes a reflective multi-layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect EUV radiation. The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The lithography system 10 also includes a projection optics module (or projection optics box (POB)) 20 for imaging the pattern of the mask 18 on to a semiconductor substrate 22 secured on a substrate stage 24 of the lithography system 10. The POB 20 has reflective optics (such as for EUV lithography system) in various embodiments. The light directed from the mask 18, carrying the image of the pattern defined on the mask 18, is collected by the POB 20. The illuminator 14 and the POB 20 are collectively referred to as an optical module of the lithography system 10.

In the present embodiment, the semiconductor substrate 22 is a semiconductor wafer, such as a silicon wafer or other type of wafer to be patterned. The semiconductor substrate 22 is coated with a resist layer sensitive to the EUV radiation in the present embodiment. Various components including those described above are integrated together and are operable to perform lithography exposing processes.

The lithography system 10 may further include other modules or be integrated with (or be coupled with) other modules. For example, the lithography system 10 may include a gas supply module designed to provide hydrogen gas to the radiation source 12. The hydrogen gas helps reduce contamination in the radiation source 12.

Figure 2:
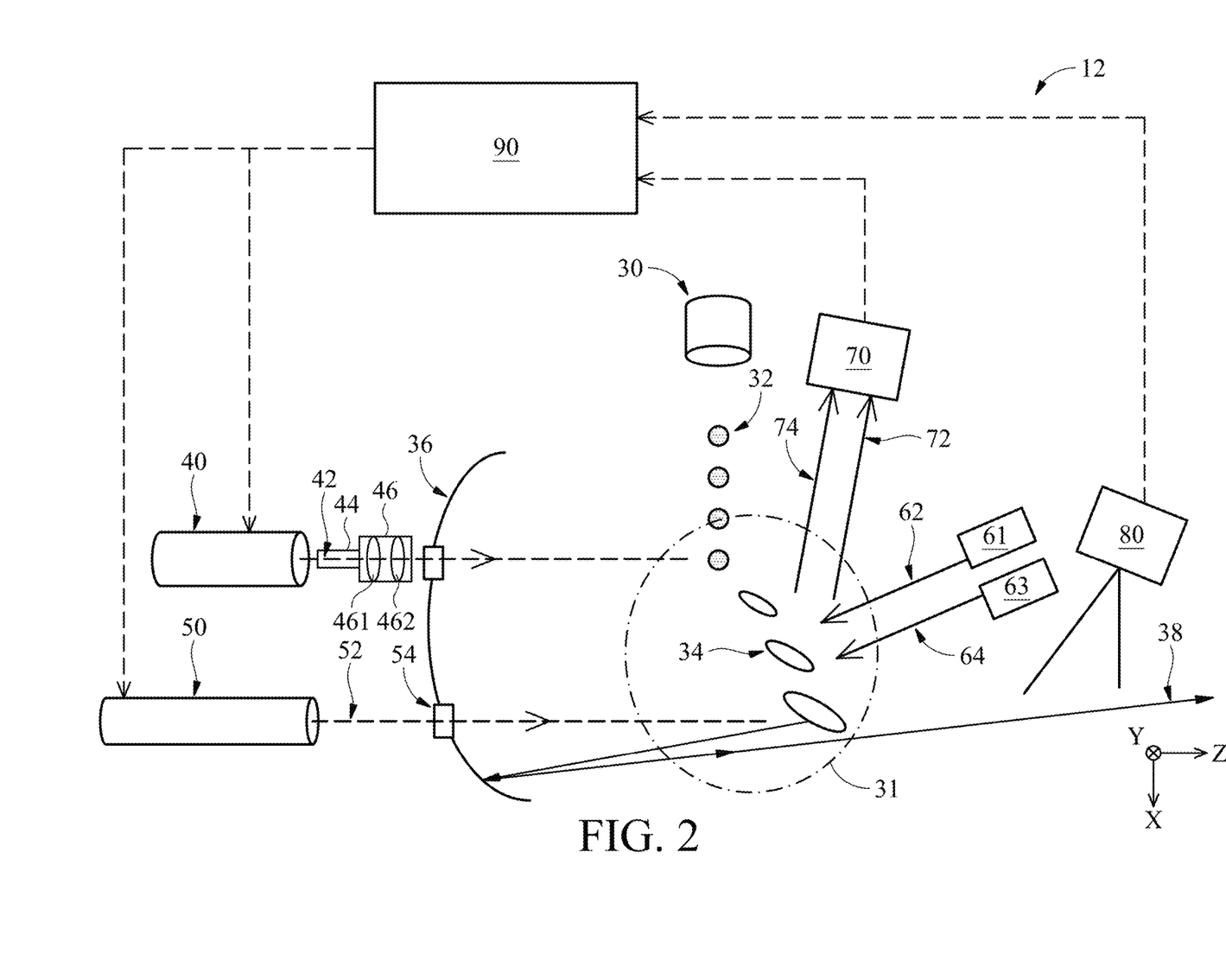
FIG. 2 is a diagrammatic view of the radiation source in the lithography system of FIG. 1, in accordance with some embodiments.

FIG. 2 illustrates the radiation source 12 in a diagrammatical view, in accordance with some embodiments. The radiation source 12 employs a dual-pulse laser produced plasma (LPP) mechanism to generate plasma and further generate EUV radiation from the plasma.

Figure 3:
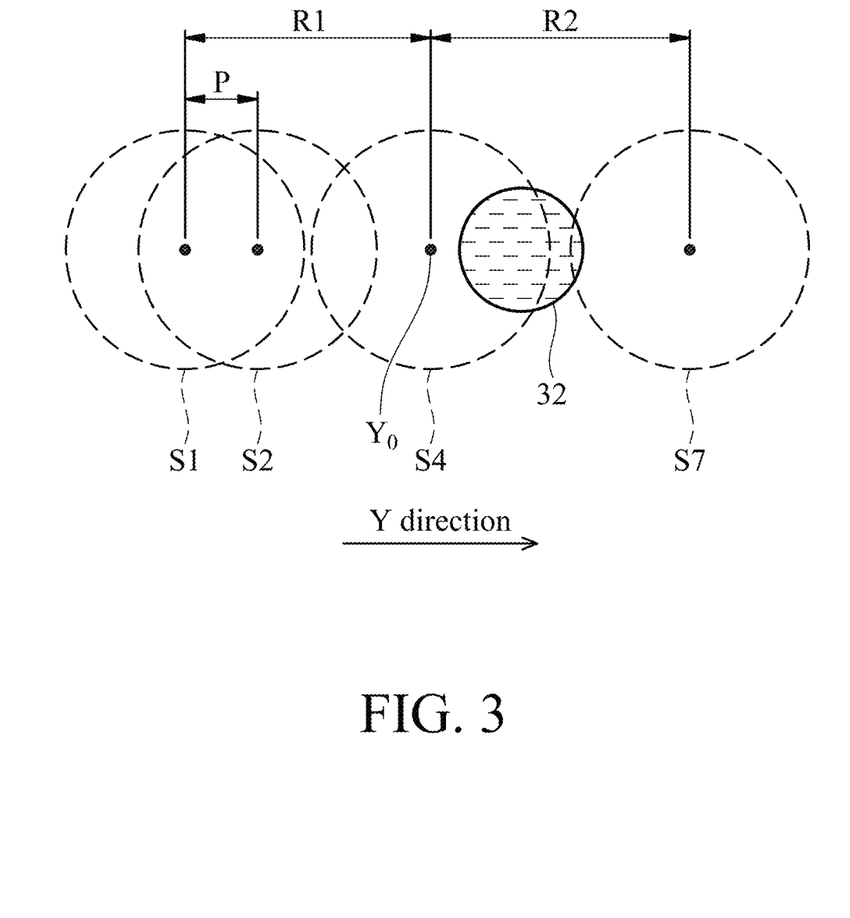
FIG. 3 is a diagram for changing a position of pre-pulse relative to a target droplet, in accordance with some embodiments.

Referring to FIGS. 2 and 3, the radiation source (or EUV radiation source) 12 includes a target droplet generator 30, a first laser source 40, a second laser source 50, an LPP collector 36, a laser beam generator 61 (FIG. 3), a laser beam generator 63 (FIG. 3), a laser beam monitor 70, an energy detector 80 and a controller 90. The components of the radiation source 12 are further described below.

The target droplet generator 30 is configured to generate target droplets 32. In an embodiment, the target droplets 32 are tin (Sn) droplets, i.e. droplets having tin or tin-containing material(s) such as eutectic alloy containing tin, lithium (Li), and xenon (Xe). In an embodiment, the target droplets 32 each have a diameter about 30 microns (μm). In an embodiment, the target droplets 32 are generated at a rate about 50 kilohertz (kHz) and are introduced into a zone of excitation 31 in the radiation source 12 at a speed about 70 meters per second (m/s).

The first laser source 40 is configured to produce laser pulses 42. The second laser source 50 is configured to produce laser pulses 52. In the present embodiment, the laser pulses 42 have less intensity and smaller spot size than the laser pulses 52. Therefore, the laser pulses 42 are also referred to as the pre-pulses, and the laser pulses 52 are also referred to as the main pulses. The pre-pulses 42 are used to heat (or pre-heat) the target droplets 32 to create low-density target plumes 34, which are subsequently heated (or reheated) by corresponding main pulses 52, generating increased emission of EUV radiation 38. In the present embodiment, a main pulse 52 is said to be "corresponding" to a pre-pulse 42 when a target plume 34 produced by the pre-pulse 42 is heated by the main pulse 52. The EUV radiation 38 is collected by the collector 36. The collector 36 further reflects and focuses the EUV radiation 38 for the lithography exposing processes, such as illustrated in FIG. 1. In an embodiment, a droplet catcher (not shown) is installed opposite the target droplet generator 30. The droplet catcher is used for catching excessive target droplets 32. For example, some target droplets 32 may be purposely missed by both the laser pulses 42 and 52.

The collector 36 is designed with proper coating material and shape, functioning as a mirror for EUV collection, reflection, and focus. In some embodiments, the collector 36 is designed to have an ellipsoidal geometry. In some embodiments, the coating material of the collector 36 is similar to the reflective multi-layer of the EUV mask 18. In some examples, the coating material of the collector 36 includes a ML (such as a plurality of Mo/Si film pairs) and may further include a capping layer (such as Ru) coated on the ML to substantially reflect the EUV radiation 38. In some embodiments, the collector 36 may further include a grating structure designed to effectively scatter the laser beams and laser pulses directed onto the collector 36. For example, a silicon nitride layer is coated on the collector 36 and is patterned to have a grating pattern. One consideration in the EUV lithography system 10 (FIG. 1) is the usable lifetime of the collector 36. During the EUV generation processes, the reflective surface of the collector 36 is subjected to the impact of various particles, ions, and radiation. Over time, the reflectivity of the collector 36 degrades due to particle accumulation, ion damages, oxidation, blistering, etc. Among these, particle (e.g., tin debris) deposition is a dominant factor. The disclosed method and apparatus help reduce tin debris on the surface of the collector 36.

In various embodiments, the pre-pulses 42 have a spot size about 100 μm or less, and the main pulses 52 have a spot size about 200 μm-300 μm, such as 225 μm. The laser pulses 42 and 52 are generated to have certain driving powers to fulfill wafer volume production, such as a throughput of 125 wafers per hour. In an embodiment, the pre-pulses 42 are equipped with about 2 kilowatts (kW) driving power, and the main pulses 52 are equipped with about 19 kW driving power. In various embodiments, the total driving power of the laser pulses 42 and 52, is at least 20 kW, such as 27 kW. In an embodiment, the first laser source 40 is a carbon dioxide ($CO_2$) laser source. In another embodiment, the first laser source 40 is a neodymium-doped yttrium aluminum garnet (Nd:YAG) laser source. In an embodiment, the second laser source 50 is a $CO_2$ laser source.

The pre-pulses 42 and main pluses 52 are directed through windows (or lens) 44 and 54, respectively, into the zone of excitation 31. The windows 44 and 54 adopt a suitable material substantially transparent to the respective laser pulses. The pre-pulses 42 and main pulses 52 are directed towards the target droplets 32 and target plumes 34 at proper angles for optimal EUV conversion efficiency. For example, the pre-pulses 42 may be aligned to interact with the target droplets 32 at an angle of few degrees (e.g., 5 degrees) off-normal. The main pulses 52 are also properly aligned with the target plumes 34 for maximum EUV conversion efficiency.

In some embodiments, the first laser source 40 include a guiding device 44 and a focusing device 46. The laser beam of pre-pulse 42 passes through the guiding device 44 and is delivered to the focusing device 46. The focusing device 46 includes one or more lenses 461, 462 and/or mirrors arranged within a beam line and configured to focus the pre-pulse 42 or change a path of the pre-pulse 42. The pre-pulse 42 is output from the focusing system 46 and is projected toward the windows 44.

Referring FIG. 3 with reference with FIG. 2, in some embodiments, positions of the pre-pulse 42 in a Y direction is changed by the focusing device 46 (FIG. 2). In the present embodiment, the Y direction is perpendicular to an X direction along which the target droplets 32 move along. The pre-pulse 42 may be moved along the Y direction and stay in multiple preset scanning positions, such as initial scanning position S1 and end scanning position S7.

The initial scanning position S1 and the end scanning position S7 may be located at two opposite sides of a default position $Y_0$. The default position $Y_0$ is located on a preset travel path of the target droplets 32. The initial scanning position S1 is distant from the default position $Y_0$ by a distance R1, and the end scanning position S7 is distant from the default position $Y_0$ by a distance R2. In some embodiments, the distance R1 is about 3 μm, and the distance R2 is about 3 μm. The focusing device 46 moving the pre-pulse 42 from an initial scanning position S1 to an end scanning position S7. As a result, a range for tuning the position (i.e. a distance between the initial scanning position to the end scanning position) of the pre-pulse is about 6 μm. However, it should be appreciated that many variations and modifications can be made to embodiments of the disclosure.

In some embodiments, multiple scanning positions are set between the initial scanning position S1 and the end scanning position S7. In one present embodiment, there are five scanning positions (only scanning position S2 and scanning position S4 are shown in FIG. 3) are set between the initial scanning position S1 and the end scanning position S7. The initial scanning position S1, the five scanning positions and the end scanning position S7 are arranged sequentially along the Y direction and spaced apart from each other by a pitch P. The pitch P may be about 1 μm. That is, an adjustment amount for tuning the position is about 1 μm. In some embodiments, the focusing system 46 is controlled by the controller 90. According to control signals transmitted from the controller 90, the focusing system 46 changes the position of the pre-pulse 42 in the Y direction.

In some embodiments, the generation of the pre-pulses 42 and main pulses 52 are synchronized with the generation of the target droplets 32. In specific, as the target droplets 32 move through the excitation zone 31 (as illustrated in FIG. 2 where the target droplets 32 move along an X direction), the pre-pulses 42 heat the target droplets 32 (along the Z direction) and transform them into low-density target plumes 34. In the embodiment shown in FIG. 2, the X and Z directions are perpendicular. In alternative embodiments, the X and Z directions may be non-perpendicular, for example, having an 85 degree inner angle.

In some embodiments, a delay between the pre-pulse 42 and the main pulse 52 is controlled by the controller 90 to allow the target plumes 34 to form and to expand. In the present embodiment, the delay between the pre-pulses 42 and the corresponding main pulses 52 is adjustable, using methods and apparatuses of the present embodiment, so that the target plumes 34 expand to an optimal size and geometry when the main pulses 52 heat them. One embodiment to determine the a delay between the pre-pulse 42 and the main pulse 52 is described below in relation to FIG. 5.

Figure 4:
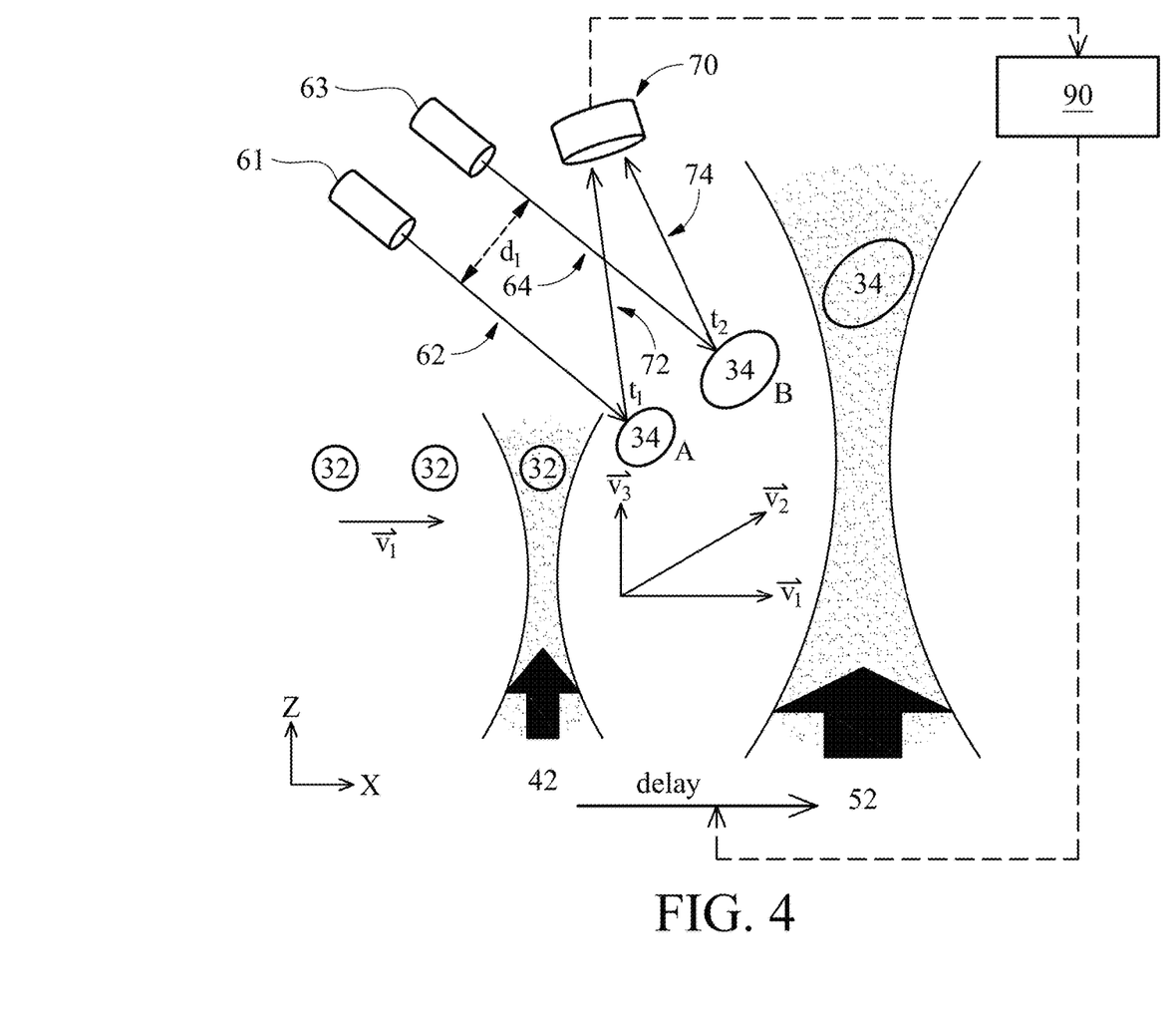
FIG. 4 is a mechanism for monitoring the speed of target plumes, constructed in accordance with some embodiments.

Referring to FIG. 4, the laser beam generators 61 and 63 and the laser beam monitor 70 are configured to monitor the speed of the target plumes 34 along its traveling path. In the present embodiment, the laser beam generator 61 is configured to produce a laser beam 62, and the laser beam generator 63 is configured to produce a laser beam 64. When approximated to be straight lines, the laser beams 62 and 64 are parallel to each other with a distance $d_1$ that is measured along a direction perpendicular to the two laser beams 62 and 64 in the same plane that the two laser beams lie. When the spot size and dispersing effects of the laser beams 62 and 64 are taken into consideration, the above approximation may be taken along the central axis of the respective laser beams. The first and second laser beams 62 and 64 may be of the same or different wavelengths. Further, the first and second laser beams 62 and 64 may be in the visible band or invisible bands such as infrared or near infrared. In some embodiments, the laser beams 62 and 64 are substantially parallel to each other, i.e., they are considered parallel for the analysis to be discussed with reference to FIG. 4, below.

FIG. 4 illustrates a target droplet 32 at different times and locations as it moves into and through the excitation zone 31 (FIG. 2). The target droplet 32 moves with an initial velocity $\vec{v_1}$ as it is released from the target droplet generator 30 (FIG. 2). The velocity $\vec{v_1}$ is along the X direction. In an embodiment, the magnitude of the velocity $\vec{v_1}$ is about 70 m/s, which can be measured and determined. After the target droplet 32 is hit by the pre-pulse 42, its velocity changes in both direction and magnitude. Its new velocity $\vec{v_2}$ is the velocity $\vec{v_1}$ combined with a velocity $\vec{v_3}$ that is caused by the pre-pulse 42. The velocity $\vec{v_3}$ is along the Z direction. In the present embodiment, the Z direction is perpendicular to the X direction.

The laser beams 62 and 64 are directed onto the path that the target plume 34 travels along. When the laser beam 62 hits the target plume 34 (at location A and time $t_1$), it is reflected as the laser beam 72. When the laser beam 64 hits the target plume 34 (at location B and time $t_2$), it is reflected as the laser beam 74. In the present embodiment, the energy level of the laser beams 62 and 64 are configured to be low enough that they do not cause any meaningful change of the velocity of the target plume 34 and high enough that the reflected laser beams 72 and 74 can be detected by the laser beam monitor 70. The reflected laser beams 72 and 74 are received by the laser beam monitor 70, which calculates the time $\Delta t = t_2 - t_1$ for the target plume 34 to travel from location A to location B. In an embodiment, the laser beam monitor 70 calculates the time $\Delta t$ using the time when it actually receives the reflected laser beams 72 and 74 as an approximation. This approximation is accurate enough because the different paths that the reflected laser beams 72 and 74 travel are negligible in the calculation, given the speed of the laser beams 72 and 74.

The controller 90 then calculates the magnitude of the velocity $\vec{v_2}$ and $\vec{v_3}$ using the time $\Delta t$ and other information such as the distance $d_1$, the angle between the laser beams 62 and 64 and the X direction, and the magnitude of the velocity $\vec{v_1}$. The magnitude of the velocity $\vec{v_2}$ and $\vec{v_3}$ is used by the controller 90 to optimize the delay between the pre-pulses 42 and the corresponding main pulses 52 (later described in relation to FIG. 9).

The energy detector 80 is configured to detect energy of EUV radiation. The energy detector 80 is either a sensor within the radiation source 12, e.g., an EUV side sensor positioned at 90° with respect to the EUV radiation 38 or a sensor within the scanner measuring energy passed through illuminator 14 and the POB 20. The amount of collected EUV energy is sensed and passed to the controller 90 for facilitating the control of the parameters of the radiation source 12.

Figure 5:
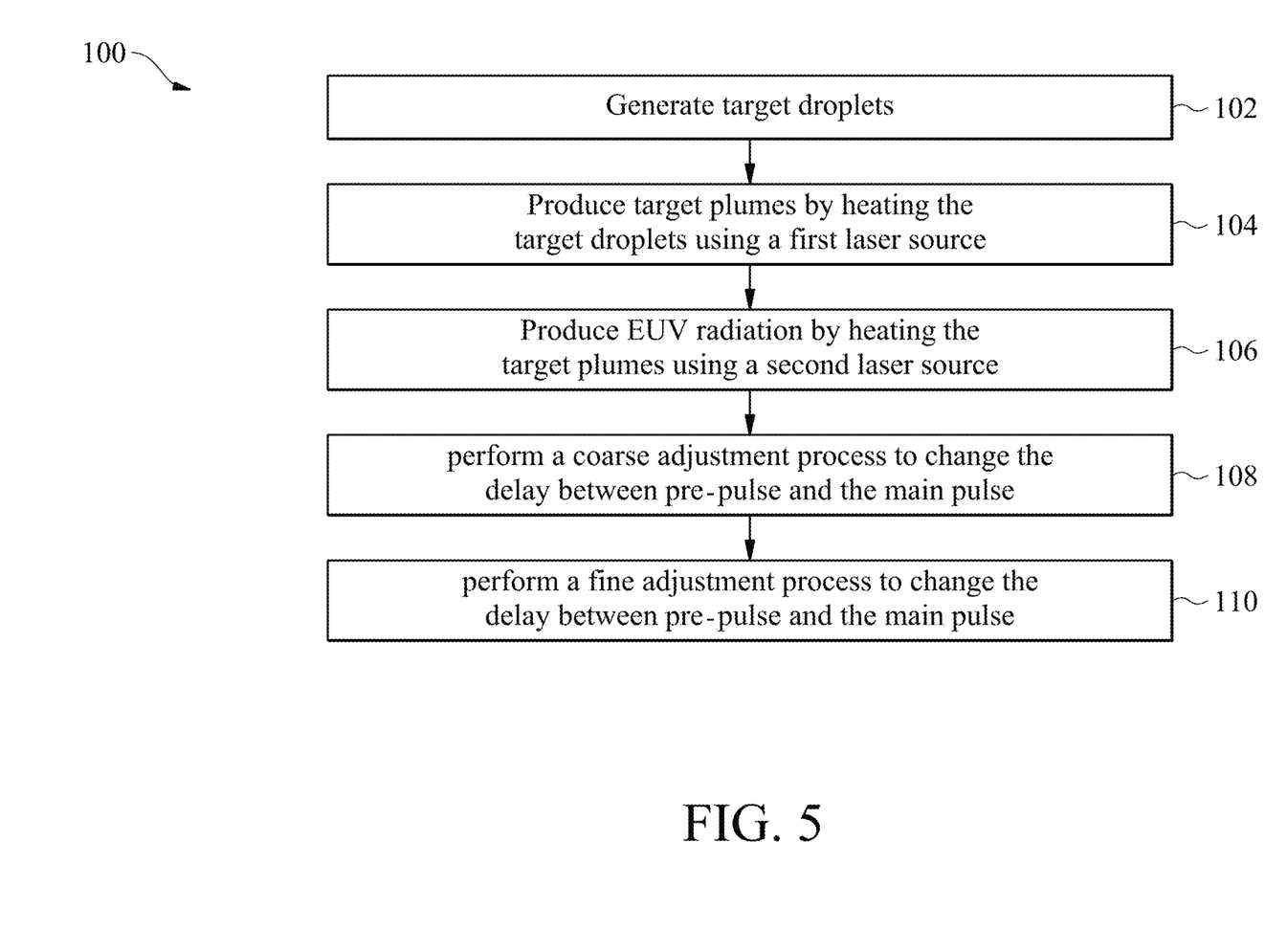
FIG. 5 is a flowchart of a method for controlling an LPP EUV radiation source, constructed in accordance with some embodiments.

FIG. 5 illustrates a method 100 for generating EUV radiation according to the present embodiment. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims. The method 100 is described below in conjunction with FIGS. 1-4 and 5-8.

At operation 102, the method 100 generates target droplets, for example, using the target droplet generator 30 (FIG. 2). The target droplets may include a tin-containing material and are directed into a zone of excitation at a predefined speed such as about 70 m/s and along a first direction.

At operation 104, the method 100 heats the target droplets by pre-pulses to produce target plumes. For example, the pre-pulses 42 may be produced by the first laser source 40 (FIG. 2).

At operation 106, the method 100 heats the target plumes by main pulses to produce EUV-irradiating plasma. For example, the main pulses 52 may be produced by the second laser source 50 (FIG. 2).

At operation 108, the method 100 perform a coarse adjustment process to change the delay between the pre-pulse 42 and the main pulse 52. In some embodiments, the coarse adjustment process includes measuring an energy of the EUV radiation multiple times. The coarse adjustment process further includes controlling the delay between the pre-pulses 42 and the main pulse 52 in two consecutive conducted measurements being different. The difference of the delay between the pre-pulses 42 and the main pulse 52 in two consecutive conducted measurements may be relative large, for example, more than 100 ns (nanoseconds). The coarse adjustment process also includes recording the energy of the EUV radiation in each of the measurements, and selecting, with the energy detector 80 or the controller 90, one of the delays between the pre-pulses 42 and the main pulse 52 which has the maximum energy as an initial delay for later use in a fine adjustment process of operation 110.

Figure 6:
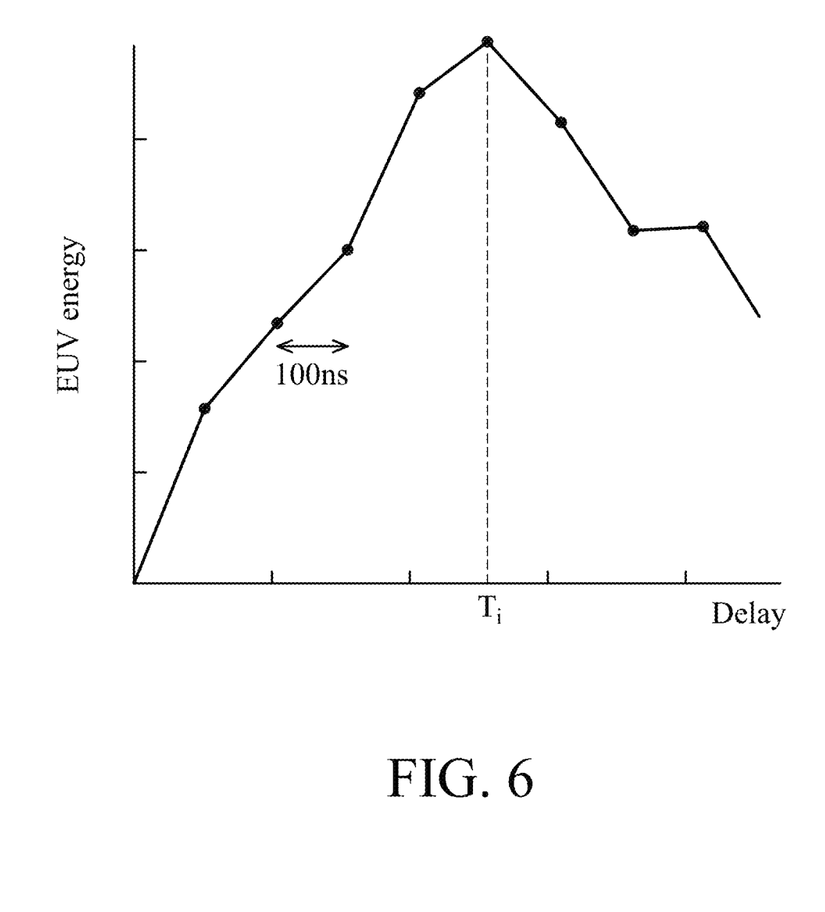
FIG. 6 is a diagram of a method for finding an initial delay for a find adjustment process, in accordance with some embodiments.

For example, the coarse adjustment process is performed by projecting the main pulse 52 over the target plumes 34 with different delays between the pre-pulses 42 and the main pulse 52 in many consecutively conducted measurements. As shown in FIG. 5, the difference of the delay in two consecutive conducted measurements may be about 100 ns. The delay in a first measurement of the coarse adjustment process may be about 3000 ns, and the delay in a last measurement of the coarse adjustment process may be 4000 ns. However, it should be appreciated that many variations and modifications can be made to embodiments of the disclosure. Afterwards, the energy detector 80 records the energy of the EUV radiation in each of the above measurements, and the energy detector 80 or the controller 90 selects one of the delays between the pre-pulses 42 and the main pulse 52 which has the maximum energy as an initial delay $T_i$, as shown in FIG. 6.

At operation 110, the method 100 perform a fine adjustment process to change the delay between the pre-pulse 42 and the main pulse 52. In some embodiments, the fine adjustment process includes measuring an energy of the EUV radiation multiple times. The fine adjustment process further includes controlling the delay between the pre-pulses 42 and the main pulse 52 in two consecutive conducted measurements being different. The difference of the delay between the pre-pulses 42 and the main pulse 52 in two consecutive conducted measurements may be relative small, for example, less than 20 ns. The fine adjustment process also includes recording the energy of the EUV radiation in each of the measurements, and selecting, with the energy detector 80 or the controller 90, one of the delays between the pre-pulses 42 and the main pulse 52 which has the maximum energy as an initial delay for later use in a lithography exposure process for a product wafer.

Figure 7:
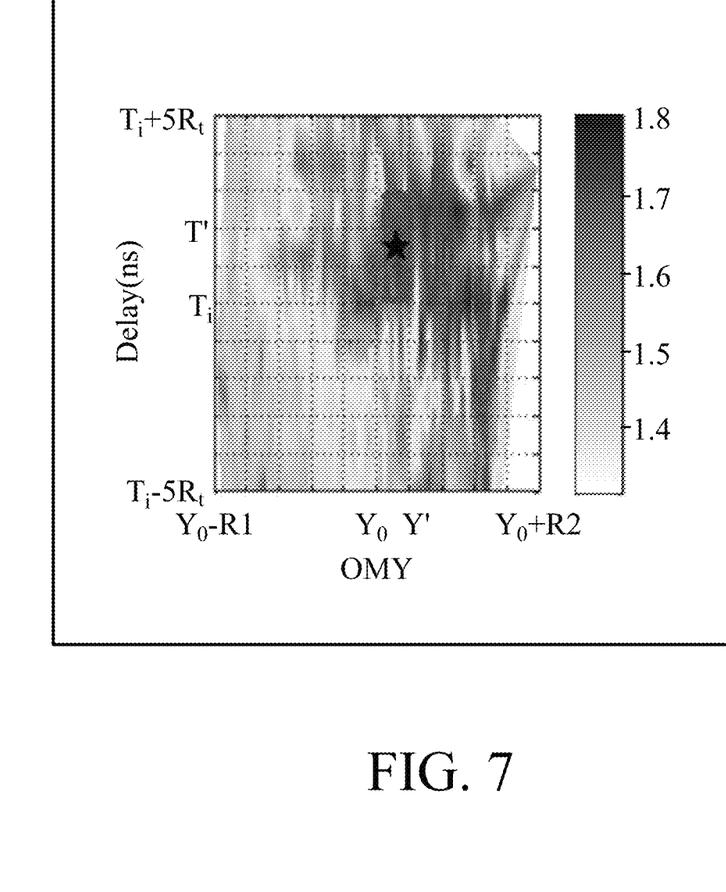
FIG. 7 is an energy diagram of an EUV radiation in relation to a delay between a pre-pulse and a main pulse and a position of the pre-pulse in a Y direction.
Figure 8:
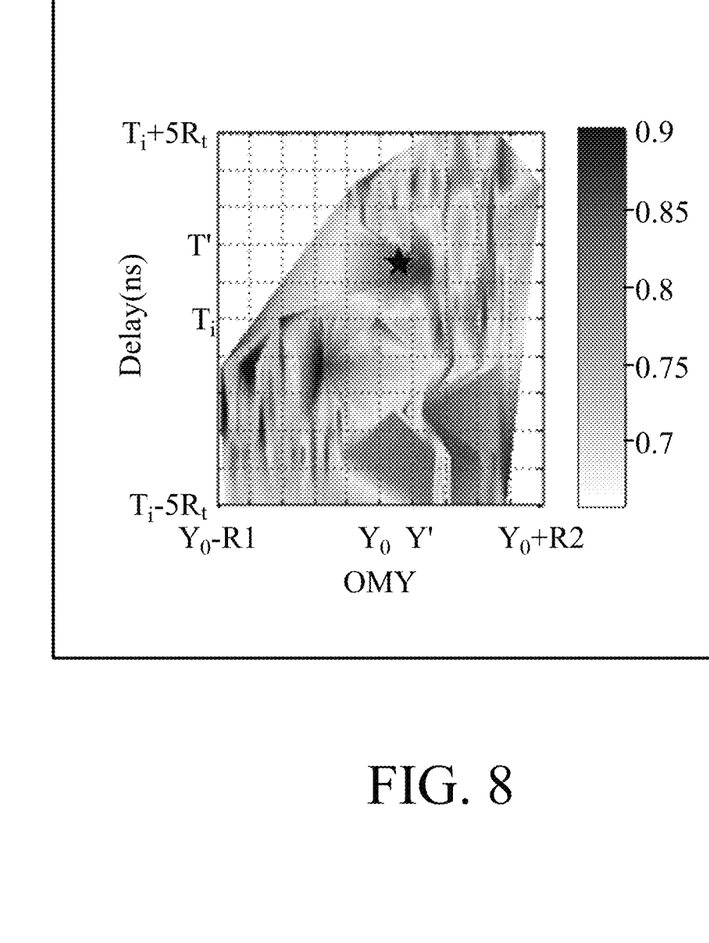
FIG. 8 is a diagram showing a stability of an EUV radiation in relation to a delay between a pre-pulse and a main pulse and a position of the pre-pulse in a Y direction.

For example, the fine adjustment process is performed by projecting the main pulse 52 over the target plumes 34 with different delays between the pre-pulses 42 and the main pulse 52 in many consecutively conducted measurements. The difference of the delay in two consecutive conducted measurements may be about 10 ns. As shown in FIG. 7, the delay in a first measurement of the fine adjustment process may be about $T_i + 5R_t$, and the delay in a last measurement of the fine adjustment process may be about $T_i - 5R_t$, where $T_i$ is the initial delay, and d is an adjustment amount of delay in two consecutively conducted measurements. In one presented embodiment, d is about 10 ns. Therefore, a range for tuning the delay is about 100 ns.

In some embodiments, the fine adjustment process are conducted multiple times, and the pre-pulse 42 is projected at different scanning positions in each of the fine adjustment processes. For example, as shown in FIG. 7, a first fine adjustment process is conducted when the pre-pulse 42 is projected at a position of $Y_0$–R1, and a last fine adjustment process is conducted when the pre-pulse 42 is projected at a position of $Y_0$+R2, where $Y_0$ is a default position of the pre-pulse 42, R1 is a distance from the default position $Y_0$ to the initial scanning position S1, and R2 is a distance from the default position $Y_0$ to the end scanning position S7.

In some embodiments, the energy detector 80 records a mean value of the energy of the EUV radiation in each measurement. Afterwards, the energy detector 80 or the controller 90 selects one of the delays between the pre-pulses 42 and the main pulse 52 which exhibits the maximum energy for later use in a lithography exposure process for a product wafer. In the embodiment shown in FIG. 7, the maximum energy is exhibited at the position designated with a star mark. Therefore, the delay amount and the position of the pre-pulse 42 corresponding to the star mark will be selected for the laser use of lithography exposure process.

In some embodiments, the energy detector 80 records the energy of the EUV radiation at an initial time period of each EUV burst (i.e. generation of EUV radiation by the projection of every single main pulse). The initial time period is of about earliest 5% of the entire time period of each EUV burst. Afterwards, the energy detector 80 or the controller 90 calculates a ratio (SOB) of the energy of the EUV radiation at an initial time period of each EUV burst and a mean value of the energy of the EUV radiation in each EUV burst. Afterwards, the energy detector 80 or the controller 90 selects one of the delays between the pre-pulses 42 and the main pulse 52 which exhibits the maximum energy for later use in a lithography exposure process for a product wafer. In the embodiment shown in FIG. 8, the maximum energy is exhibited at the position designated with a star mark.

Figure 9:
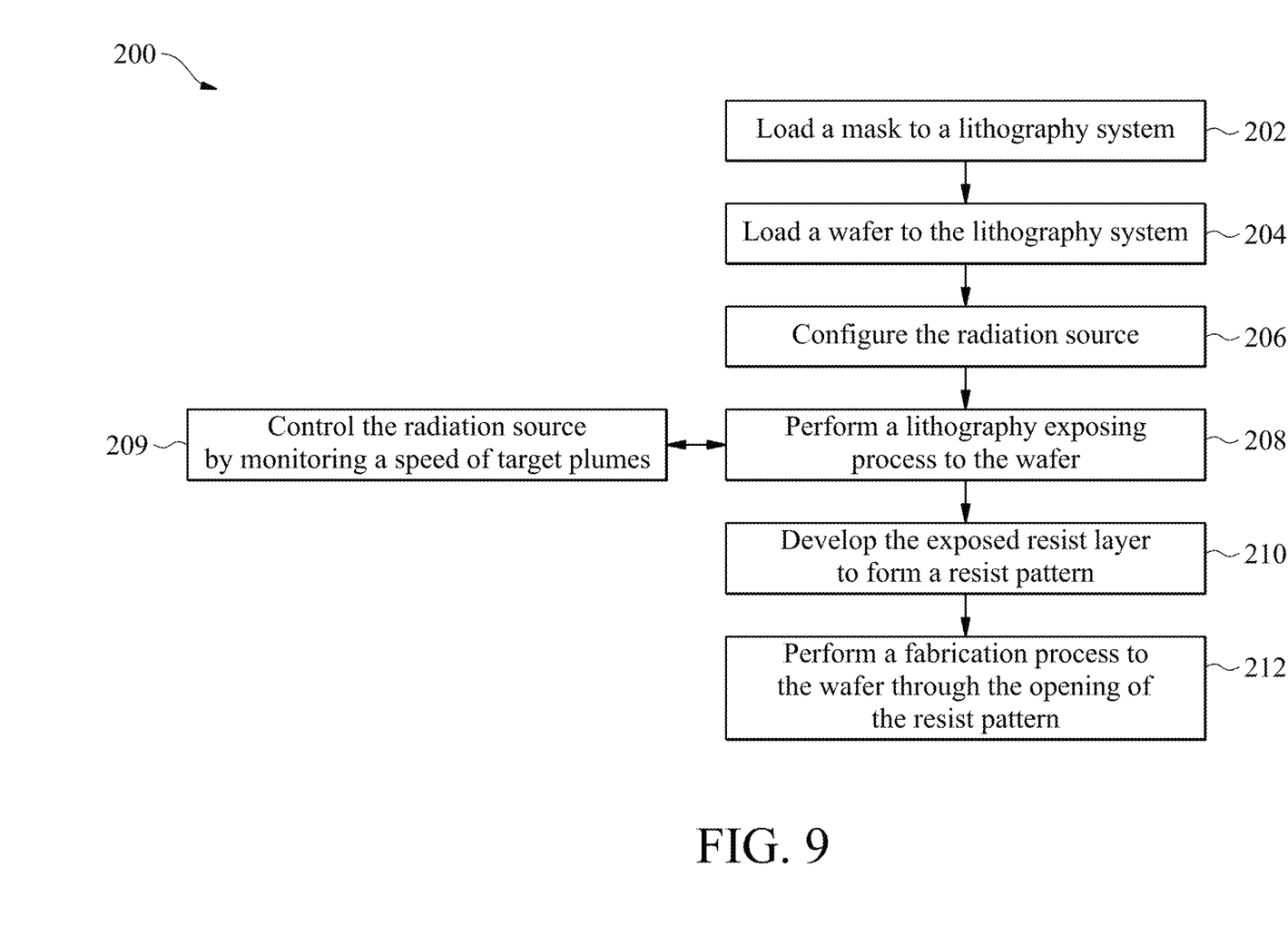
FIG. 9 is a flowchart of a lithography process constructed in accordance with some embodiments.

FIG. 9 is a flowchart of a method 200 for a EUV lithography process implemented by the EUV lithography system 10, constructed in accordance with some embodiments. Additional operations can be provided before, during, and after the method 200, and some operations described can be replaced, eliminated, or moved around for additional embodiments of the method. The method 200 is an example, and is not intended to limit the present disclosure beyond what is explicitly recited in the claims. The method 200 is described below in conjunction with FIGS. 1, 2, 7 and 8.

The method 200 includes an operation 202 which loads an EUV mask, such as the mask 18 to the lithography system 10 that is operable to perform an EUV lithography exposing process. The mask 18 includes an IC pattern to be transferred to a semiconductor substrate, such as the wafer 22. The operation 202 may further include various steps, such as securing the mask 18 on the mask stage 16 and performing an alignment.

The method 200 includes an operation 204 which loads the wafer 22 to the lithography system 10. The wafer 22 is coated with a resist layer. In the present embodiment, the resist layer is sensitive to the EUV radiation from the radiation source 12 of the lithography system 10.

The method 200 includes an operation 206 which configures the EUV radiation source 12. Operation 206 includes configuring the target droplet generator 30, configuring the first laser source 40, configuring the second laser source 50, and configuring the controller 90. The target droplet generator 30 is configured to generate the target droplets 32 with proper material, proper size, proper rate, and proper movement speed and direction. The first laser source 40 is configured to generate the pre-pulses 42 at the position of Y' shown in FIG. 7 or FIG. 8. The second laser source 50 is configured to generate the main pulses 52 a certain time after the corresponding pre-pulses 42 (i.e. The delay T' shown in FIG. 7 or FIG. 8).

The method 200 includes an operation 208 by performing a lithography exposing process to the wafer 22 in the lithography system 10. In the operation 208, the target droplet generator 30 and the laser sources 40 and 50 are turned on and are operated according to the configuration in the operation 206. The pre-pulses 42 heat the target droplets 32 to produce target plumes 34. The main pulses 52 heat the target plumes 34, producing plasma, which emits EUV radiation. During the operation 208, the EUV radiation generated by the radiation source 12 is illuminated on the mask 18 (by the illuminator 14), and is further projected on the resist layer coated on the wafer 22 (by the POB 20), thereby forming a latent image on the resist layer. In some embodiments, the lithography exposing process is implemented in a scan mode.

The method 200 includes an operation 209 which controls the EUV radiation source 12 to optimize EUV conversion efficiency by monitoring the speed of target plumes. During the operation 209, the first and second laser beams 62 and 64 are directed towards the target plumes 34. The laser beam monitor 70 receives the reflected first and second laser beams 72 and 74 and calculates a delay between the reflected laser beams 72 and 74. The controller 90 calculates a speed of the target plumes using the delay between the reflected laser beams 72 and 74, as well as other information. The second laser source 50 may adjust a delay T' between a main pulse 52 and a corresponding pre-pulse 42 based on the calculated speed of the target plumes. The operation 209 ensures that the target plumes 34 have optimal shape and size when heated by the main pulses 52, thereby increasing EUV conversion efficiency and reducing the amount of debris on the LPP collector 36. In the present embodiment, the operations 208 and 209 are performed simultaneously. In some embodiments, operation 209 is omitted.

The method 200 may include other operations to complete the lithography process. For example, the method 200 may include an operation 210 by developing the exposed resist layer to form a resist pattern having a plurality of openings defined thereon. Particularly, after the lithography exposing process at the operation 208, the wafer 22 is transferred out of the lithography system 10 to a developing unit to perform a developing process to the resist layer. The method 200 may further include other operations, such as various baking steps. As one example, the method 200 may include a post-exposure baking (PEB) step between the operations 208 and 210.

The method 200 may further include other operations, such as an operation 212 to perform a fabrication process to the wafer through the openings of the resist pattern. In one example, the fabrication process includes an etch process to the wafer 22 using the resist pattern as an etch mask. In another example, the fabrication process includes an ion implantation process to the wafer 22 using the resist pattern as an implantation mask.

Although not intended to be limiting, one or more embodiments of the present disclosure provide many benefits to the manufacturing of a semiconductor device. For example, embodiments of the present disclosure provide apparatus and methods for increasing EUV conversion efficiency while reducing contamination on LPP collectors. Embodiments of the present disclosure can be implemented or integrated into existing EUV lithography systems.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

In accordance with some embodiments, an extreme ultraviolet (EUV) radiation source is provided. The EUV radiation source includes a target droplet generator configured to generate target droplets. The EUV radiation source further includes a first laser source configured to generate pre-pulses that heat the target droplets to produce target plumes. The EUV radiation source also includes a second laser source configured to generate main pulses that heat the target plumes to produce plasma emitting EUV radiation. In addition, the EUV radiation source includes a controller configured to adjust at least one parameter of the first and second laser sources comprising a delay between one of the pre-pulses and a corresponding one of the main pulses, and positions of the pre-pulses in a Y direction that is different from an X direction along which the target droplets travel. The EUV radiation source further includes an energy detector configured to monitor an energy of the EUV radiation and record the parameters of the first and second laser sources with which the energy of the EUV radiation is maximized.

In accordance with some embodiments, an extreme ultraviolet (EUV) lithography system is provided. The EUV lithography system includes the above-mentioned extreme ultraviolet (EUV) radiation source. The EUV lithography system further includes a collector configured to collect and reflect the EUV radiation and a mask stage configured to secure an EUV mask. The EUV lithography system also includes a wafer stage configured to secure a semiconductor wafer. In addition, the EUV lithography system includes one or more optical modules configured to direct the EUV radiation from the radiation source to image an integrated circuit (IC) pattern defined on the EUV mask onto the semiconductor wafer.

In accordance with some embodiments, a method for extreme ultraviolet (EUV) lithography is provided. The method includes generating a target droplet. The method further includes producing a target plume by heating the target droplet with a pre-pulse generated by a first laser source. The method also includes producing EUV-radiating plasma by heating the target plume with a main pulse generated by a second laser source. In addition, the method includes adjusting at least one parameter of the first and second laser sources comprising a delay between the pre-pulse and the main pulse, and positions of the pre-pulse in a Y direction that is different from an X direction along which the target droplets travel. The method further includes monitoring an energy of the EUV radiation and recording the parameters of the first and second laser sources with which the energy of the EUV radiation is maximized.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An extreme ultraviolet (EUV) radiation source, comprising:
    a target droplet generator configured to generate target droplets;
    a first laser source configured to generate pre-pulses that heat the target droplets to produce target plumes;
    a second laser source configured to generate main pulses that heat the target plumes to produce plasma emitting EUV radiation;
    a controller configured to adjust at least one parameter of the first and second laser sources comprising a delay between one of the pre-pulses and a corresponding one of the main pulses, and positions of the pre-pulses in a Y direction that is different from an X direction along which the target droplets travel;
    an energy detector configured to monitor an energy of the EUV radiation and record the parameters of the first and second laser sources with which the energy of the EUV radiation is maximized;
    a first laser beam generator and a second laser beam generator configured to generate first and second laser beams, respectively, that are directed onto a travel path of the target plumes, wherein the first and second laser beams are substantially parallel; and
    a laser beam monitor configured to receive the first and second laser beams reflected by the target plumes to determine a real-time velocity of the target plumes in their traveling path.

2. The EUV radiation source as claimed in claim 1, wherein one of the main pulses heats the target plumes produced by the corresponding one of the pre-pulses.

3. The EUV radiation source as claimed in claim 1, wherein a range for tuning the delay is 100 ns (nanoseconds), and an amount in each adjustment for tuning the delay is 10 ns.

4. The EUV radiation source as claimed in claim 1, wherein the Y direction is perpendicular to the X direction.

5. The EUV radiation source as claimed in claim 1, wherein a range for tuning each of the positions is 6 μm, and an amount in each adjustment for tuning each of the positions is 1 μm.

6. The EUV radiation source as claimed in claim 1, wherein the energy detector records the energy of the EUV radiation at an initial time period of each EUV burst.

7. The EUV radiation source as claimed in claim 1, wherein the controller is configured to adjust the delay between the one of the pre-pulses and the corresponding one of the main pulses according to the real-time velocity of the target plumes in its traveling path.

8. The EUV radiation source as claimed in claim 1, wherein the pre-pulses heat the target droplets along a Z direction and the Y direction is substantially perpendicular to both the X direction and the Z direction.

9. The EUV radiation source as claimed in claim 6, wherein the initial time period is the earliest 5% of the entire time period of the each EUV burst.

10. An extreme ultraviolet (EUV) lithography system, comprising:
- a radiation source, wherein the radiation source comprises:
- a target droplet generator configured to generate target droplets;
- a first laser source configured to generate pre-pulses that heat the target droplets to produce target plumes;
- a second laser source configured to generate main pulses that heat the target plumes to produce plasma emitting EUV radiation;
- a controller configured to adjust at least one parameter of the first and second laser sources comprising a delay between one of the pre-pulses and a corresponding one of the main pulses, and positions of the pre-pulses in a Y direction that is different from an X direction along which the target droplets travel;
- an energy detector configured to monitor an energy of the EUV radiation and record the parameters of the first and second laser sources with which the energy of the EUV radiation is maximized;
- a collector configured to collect and reflect the EUV radiation;
- a mask stage configured to secure an EUV mask;
- a wafer stage configured to secure a semiconductor wafer;
- one or more optical modules configured to direct the EUV radiation from the radiation source to image an integrated circuit (IC) pattern defined on the EUV mask onto the semiconductor wafer;
- a first laser beam generator and a second laser beam generator configured to generate first and second laser beams, respectively, that are directed onto a travel path of the target plumes, wherein the first and second laser beams are substantially parallel; and
- a laser beam monitor configured to receive the first and second laser beams reflected by the target plumes to determine a real-time velocity of the target plumes in their traveling path.

11. The EUV lithography system as claimed in claim 10, wherein one of the main pulses heats the target plumes produced by the corresponding one of the pre-pulses.

12. The EUV lithography system as claimed in claim 10, wherein a range for tuning the delay is 100 ns (nanoseconds), and an amount in each adjustment for tuning the delay is 10 ns.

13. The EUV lithography system as claimed in claim 10, wherein the Y direction is perpendicular to the X direction.

14. The EUV lithography system as claimed in claim 10, wherein a range for tuning each of the positions is 6 µm, and an amount in each adjustment for tuning each of the positions is 1 µm.

15. The EUV lithography system as claimed in claim 10, wherein the energy detector monitors the energy of the EUV radiation at an initial time period of each EUV burst.

16. A method for extreme ultraviolet (EUV) lithography, the method comprising:
- generating a target droplet;
- producing a target plume by heating the target droplet with a pre-pulse generated by a first laser source;
- producing EUV-radiating plasma by heating the target plume with a main pulse generated by a second laser source;
- adjusting at least one parameter of the first and second laser sources comprising a delay between the pre-pulse and the main pulse, and a position of the pre-pulse in a Y direction that is different from an X direction along which the target droplet travel;
- monitoring an energy of the EUV radiation and recording the parameters of the first and second laser sources with which the energy of the EUV radiation is maximized;
- generating first and second laser beams that are directed onto a travel path of the target plume, wherein the first and second laser beams are substantially parallel; and
- receiving the first and second laser beams reflected by the target plume to determine a real-time velocity of the target plume in its traveling path.

17. The method as claimed in claim 16, wherein a range for tuning the delay is 100 ns (nanoseconds), and an amount in each adjustment for tuning the delay is 10 ns.

18. The method as claimed in claim 16, wherein a range for tuning the position is 6 µm, and an amount in each adjustment for tuning the position is 1 µm.

19. The method as claimed in claim 16, wherein a mean value of the energy of the EUV radiation of each EUV burst is monitored and recorded.

20. The method as claimed in claim 16, wherein the energy of the EUV radiation at an initial time period of each EUV burst is monitored and recorded, and the initial time period is the earliest 5% of the entire time period of the each EUV burst.

* * * * *